(12) United States Patent
Kim et al.

(10) Patent No.: US 11,256,353 B2
(45) Date of Patent: Feb. 22, 2022

(54) TOUCH SENSOR, AND WINDOW LAMINATE AND IMAGE DISPLAY DEVICE INCLUDING THE SAME

(71) Applicant: DONGWOO FINE-CHEM CO., LTD., Iksan-si (KR)

(72) Inventors: Junha Kim, Pyeongtaek-si (KR); Jin Koo Lee, Hwaseong-si (KR); Wonjong Lee, Yongin-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 16/902,956

(22) Filed: Jun. 16, 2020

(65) Prior Publication Data
US 2020/0409497 A1  Dec. 31, 2020

(30) Foreign Application Priority Data

Jun. 25, 2019  (KR) .................. 10-2019-0075483
Jul. 4, 2019  (KR) .................. 10-2019-0080948

(51) Int. Cl.
*G06F 3/041*  (2006.01)
*H05K 1/02*  (2006.01)

(52) U.S. Cl.
CPC ......... *G06F 3/0412* (2013.01); *H05K 1/0281* (2013.01); *G06F 2203/04102* (2013.01)

(58) Field of Classification Search
CPC ............................ G06F 3/0412; H05K 1/0281
USPC ................................................... 345/173, 178
See application file for complete search history.

(56) References Cited

U.S. PATENT DOCUMENTS

| | | | |
|---|---|---|---|
| 2016/0035759 A1* | 2/2016 | Kwon ................ | H01L 51/0097 257/40 |
| 2017/0023979 A1* | 1/2017 | Yamazaki ........... | H01L 51/0097 |
| 2018/0076229 A1* | 3/2018 | Kwon .................. | H01L 23/562 |
| 2018/0120975 A1* | 5/2018 | Kim .................... | H01L 51/5281 |
| 2018/0188852 A1* | 7/2018 | Choi ................... | G06F 3/0443 |
| 2018/0342699 A1* | 11/2018 | Son .................... | H01L 51/5281 |
| 2020/0185641 A1* | 6/2020 | Jeong ................ | H01L 51/5237 |

FOREIGN PATENT DOCUMENTS

KR   10-2019-0030302 A   3/2019

* cited by examiner

*Primary Examiner* — Prabodh M Dharia
(74) *Attorney, Agent, or Firm* — Sughrue Mion, PLLC

(57) ABSTRACT

A touch sensor includes: a display portion including a base layer and a touch sensor layer on the base layer; a bending portion extending from the display portion and including a first part of a trace electrically connected to the touch sensor layer but not including the base layer; and a bonding portion extending from the bending portion and including a second part of the trace, wherein an end portion of the second part of the trace is connected to a flexible circuit board.

18 Claims, 6 Drawing Sheets

[Figure 1A]
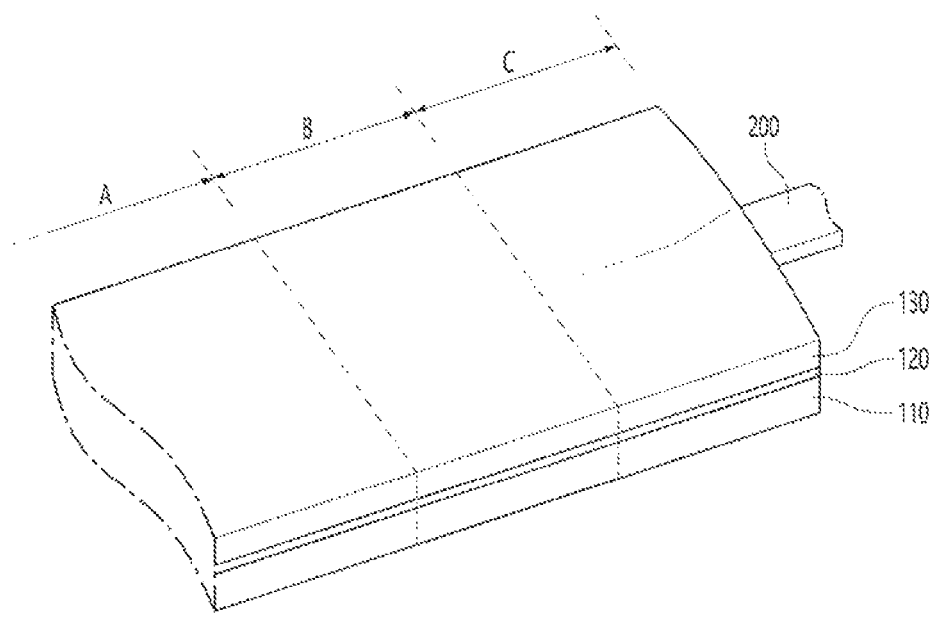
[Figure 1B]
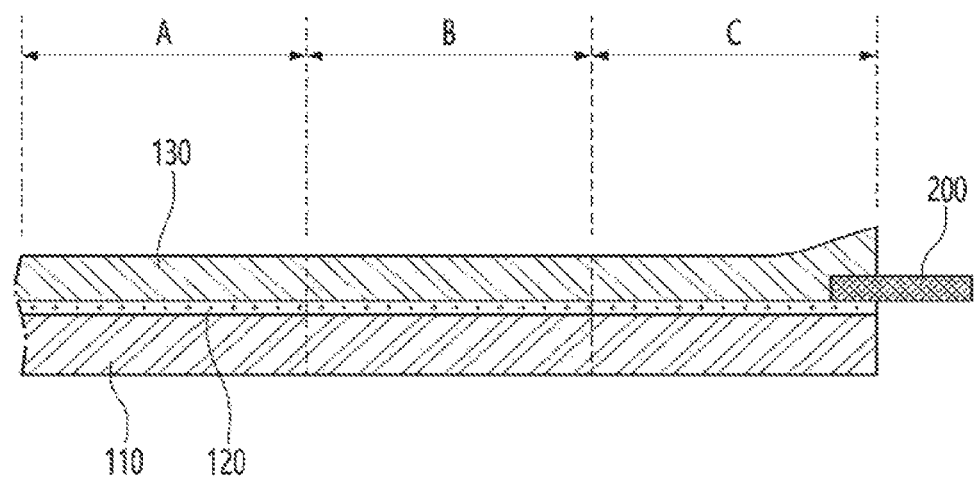

[Figure 2]
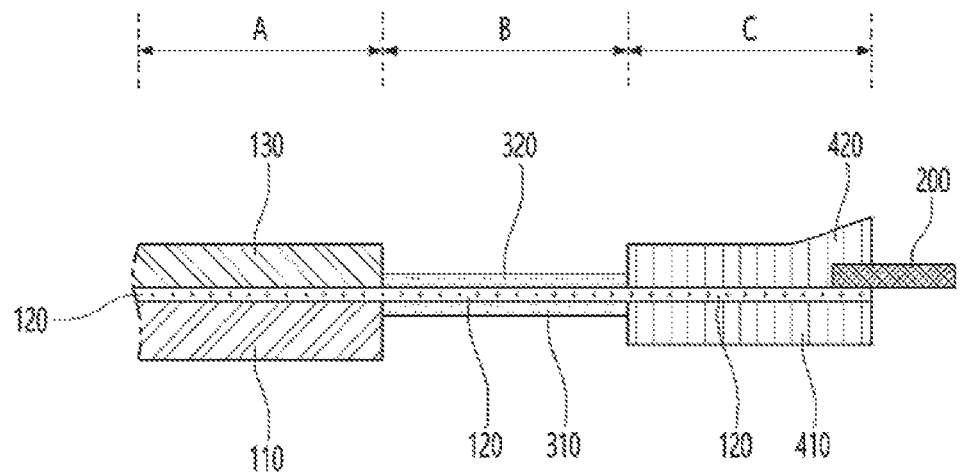
[Figure 3]
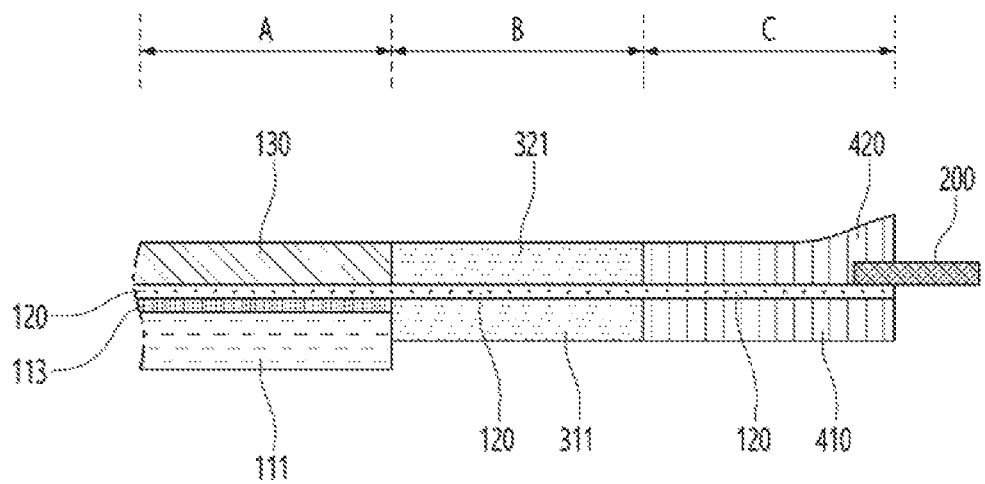

[Figure 4]
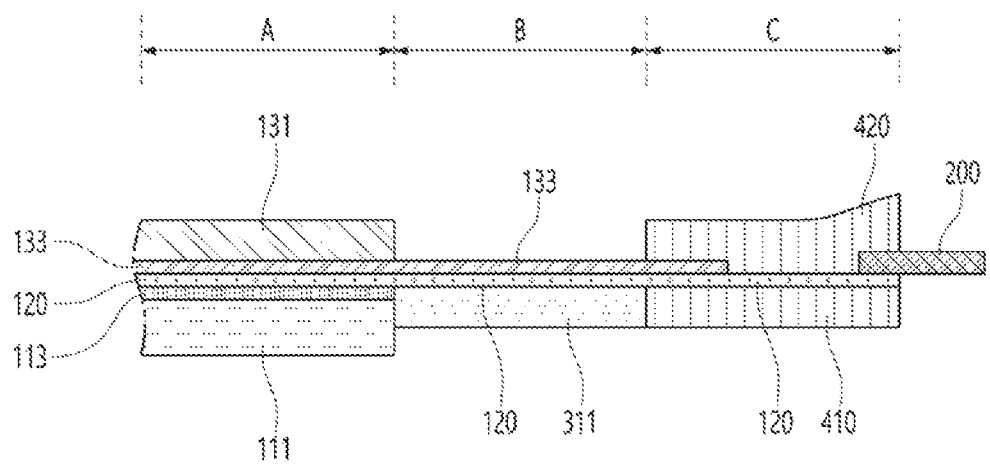
[Figure 5]
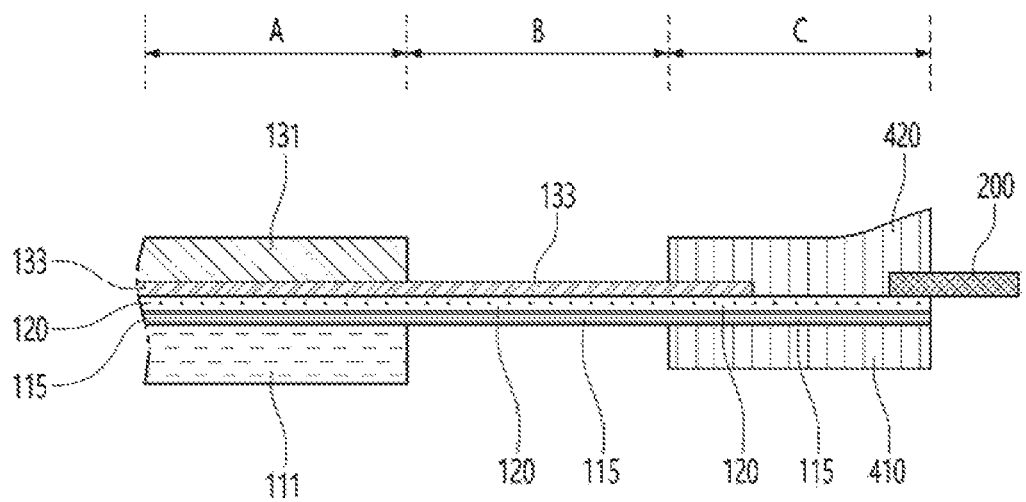

[Figure 6]
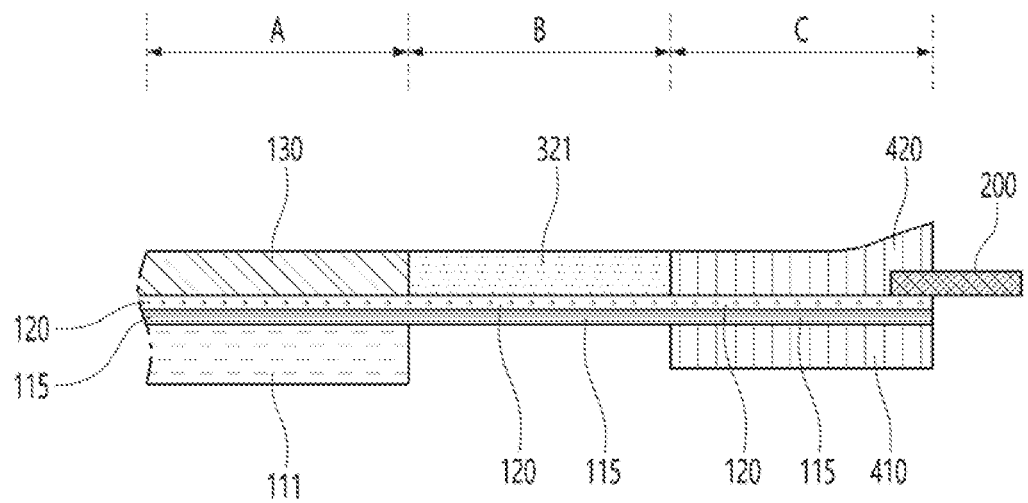
[Figure 7]
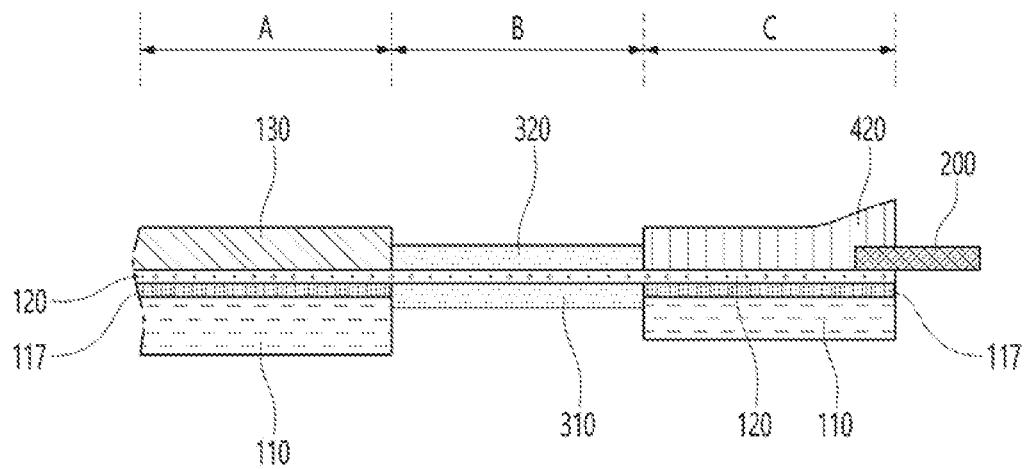

[Figure 8A]
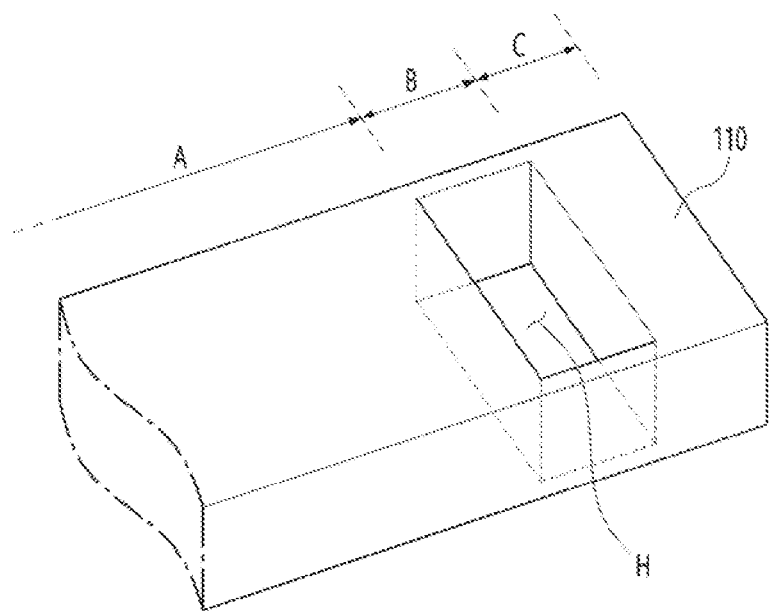
[Figure 8B]
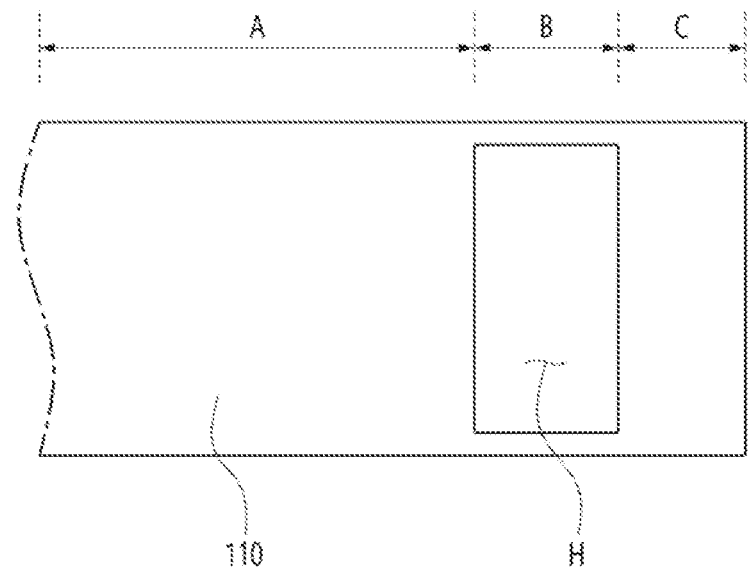

[Figure 8C]
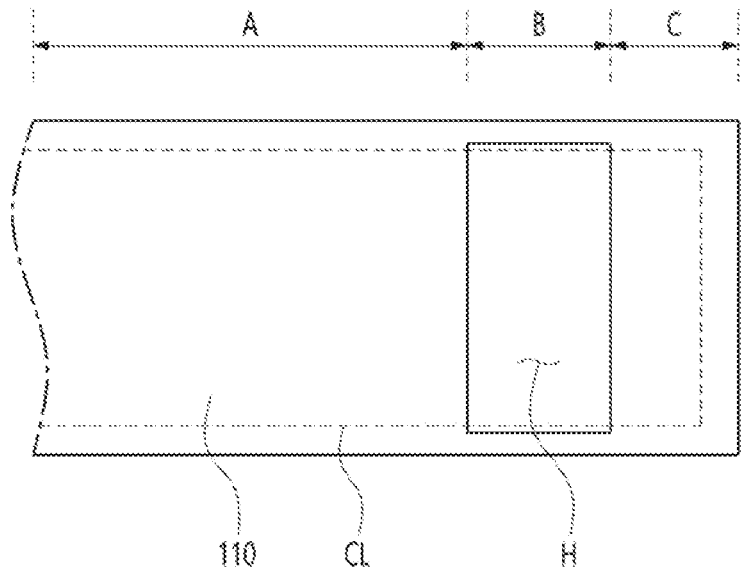
[Figure 8D]
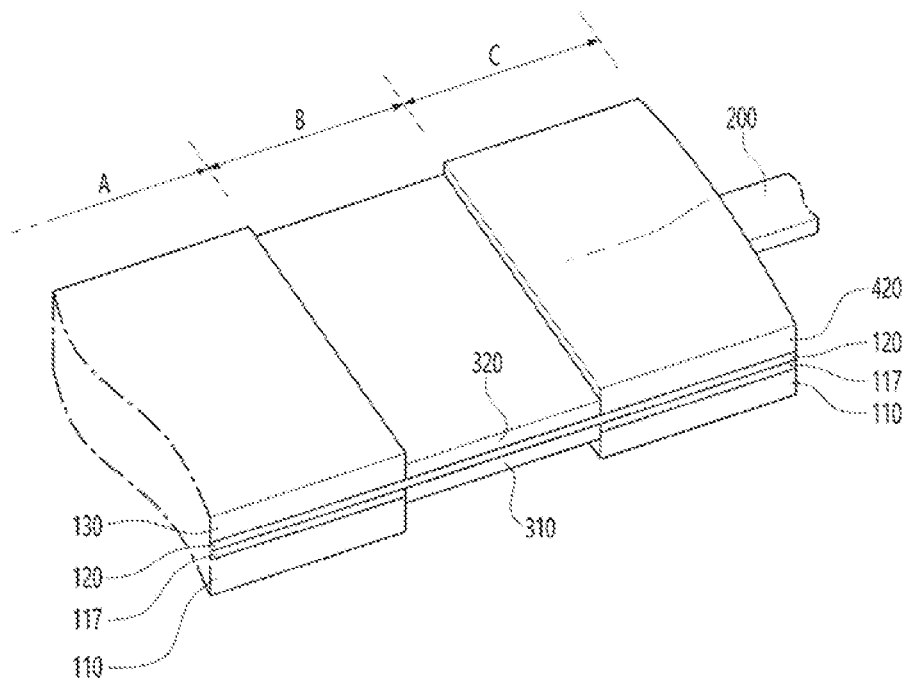

TOUCH SENSOR, AND WINDOW LAMINATE AND IMAGE DISPLAY DEVICE INCLUDING THE SAME

CROSS REFERENCE TO RELATED APPLICATIONS

The instant application claims priority based on Korean Patent Application No. 10-2019-0075483 fled Jun. 25, 2019 and Korean Patent Application No. 10-2019-0080948 filed Jul. 4, 2019, the entire contents of which are hereby incorporated by reference.

TECHNICAL FIELD

The present invention relates to a touch sensor. Particularly, the present invention relates to a touch sensor having a bending portion.

BACKGROUND ART

A display device is a device that displays information externally, examples of which include a liquid crystal display device, a plasma display panel device, an electroluminescent display device, and an organic light-emitting diode display device.

The display device includes a touch sensor panel that is an apparatus for inputting a user's command by touching contents displayed on the screen with a finger or a pen. The touch sensor panel includes a plurality of sensing electrodes that sense a contact position. The sensing electrodes can be divided into the first sensing electrodes connected in the X-axis direction and the second sensing electrodes connected in the Y-axis direction, and they can be connected to a trace. The trace is connected to an FPCB at the end, and the FPCB is connected to the main PCB, so that the sensing signal of the touch sensor panel can be transmitted to the outside.

The touch sensor panel is located on the upper portion of the display panel. In this case, the sensing electrodes are placed in a display region of the display panel, and the trace and the FPCB bonding portion are placed in a non-display region at the edges of the display region, i.e. a bezel region.

Recently, efforts have been made to expand the display region by reducing the bezel region of the display device. As part of such efforts, research is being actively conducted to minimize the bezel region by bending the trace and the FPCB bonding portion of the touch sensor panel to the rear and placing them on the rear side of the display panel.

FIG. 1A and FIG. 1B are perspective and sectional views of a touch sensor according to the prior art, respectively.

As shown in FIG. 1A and FIG. 1B, a conventional touch sensor comprises a display portion A including a sensing electrode, a bending portion B extending and bending from the display portion A, a bonding portion C extending from the bending portion B to be bonded and connected to an FPCB 200, and so on. Here, the bending portion B includes a base layer 110, a touch sensor layer 120, a protective layer 130, and so on.

The base layer 110 is made of a film material, for example, polyethylene ether phthalate, polyethylene naphthalate, polycarbonate, polyarylate, polyetherimide, polyether sulfonic acid, polyimide, and the like. However, such base layer 110 is thick and has a high elastic modulus to satisfy a supporting role, which may make the bending portion B difficult to be bent and cause cracks in the bending portion touch sensor layer during bending.

DISCLOSURE OF INVENTION

Technical Problem

The present invention is to solve the above problems of the prior art.

Thus, it is intended to provide a touch sensor having the following features:

first, in a touch sensor having a bending portion, the bending portion can be easily bent;

second, it is possible to prevent damage such as cracks from occurring in the touch sensor layer of the bending portion; and third, when the structure of the bending portion is differently formed for easy bending of the bending portion, the process of separately forming a lower support base for FPCB bonding in the FPCB bonding process is eliminated, thereby achieving process simplification, process time shortening, and manufacturing cost reduction.

Technical Solution

A touch sensor of the present invention for achieving the above object may comprise a display portion, a bending portion, a bonding portion, and so on.

The display portion may include a base layer and a touch sensor layer on the base layer.

The bending portion may extend from the display portion and may include a first part of a trace electrically connected to the touch sensor layer but may not include the base layer.

The bonding portion may extend from the bending portion and include a second part of the trace, wherein an end portion of the second part of the trace may be connected to a flexible circuit board.

In the touch sensor of the present invention, the bending portion may include a bending portion protective layer on an upper or a lower surface of the trace.

In the touch sensor of the present invention, the bending portion protective layer may be made of a curable resin. The curable resin may be selected from a UV curable resin, an optically clear adhesive (OCA), and a pressure sensitive adhesive (PSA).

In the touch sensor of the present invention, the bending portion may be thinner than the display portion and the bonding portion.

In the touch sensor of the present invention, the bending portion may includes a bending portion touch sensor layer extending from the touch sensor layer of the display portion and having a thickness of 2 to 10 μm.

In the touch sensor of the present invention, the bending portion protective layer may have an elastic modulus of 0.1 to 1,000 Mpa.

In the touch sensor of the present invention, the base layer may include at least one of a polarizer, a polarizing plate, a retardation film, a reflective sheet, a brightness enhancing film, and a refractive index matching film.

In the touch sensor of the present invention, the bonding portion may include an upper support base and a lower support base on an upper surface and a lower surface of the flexible circuit board, respectively.

In the touch sensor of the present invention, the upper support base and the lower support base may overlap with the second part of the trace included in the bonding portion.

In the touch sensor of the present invention, the lower support base may be the same as the base layer of the display portion.

In the touch sensor of the present invention, the base layer and the lower support base may have a through hole in a region of the bending portion.

The touch sensor of the present invention may further comprise an adhesive layer between the base layer and the touch sensor layer of the display portion and between the lower support base and the trace of the bonding portion.

In the touch sensor of the present invention, the adhesive layer may have a through hole in a region of the bending portion.

A window laminate according to the present invention may comprise a window substrate and the touch sensor which is described above and stacked on one surface of the window substrate.

An image display device according to the present invention may comprise a display panel and the touch sensor which is described above and stacked on one surface of the display panel.

Advantageous Effects

According to the touch sensor of the present invention having such a configuration, the bending portion of the touch sensor can be easily bent by minimizing or optimizing the thicknesses of a bending portion touch sensor layer and a bending portion protective layer protecting the bending portion touch sensor layer.

According to the touch sensor of the present invention, it is possible to prevent or minimize damage to the bending portion touch sensor layer by optimizing the elastic modulus of the bending portion protective layer to minimize stress applied to the bending portion touch sensor layer by the bending portion protective layer.

In addition, according to the touch sensor of the present invention, by forming the lower support base of the bonding portion in the same process as the base layer of the display portion, there is no need to further configure the lower support base for bonding in the FPCB bonding process, thereby achieving process simplification, process time shortening, and manufacturing cost reduction.

DESCRIPTION OF DRAWINGS

FIG. 1A and FIG. 1B are perspective and sectional views of a touch sensor according to the prior art, respectively.

FIG. 2 is a sectional view illustrating the first embodiment of a touch sensor having a bending portion according to the present invention.

FIG. 3 is a sectional view illustrating the second embodiment of a touch sensor having a bending portion according to the present invention.

FIG. 4 is a sectional view illustrating the third embodiment of a touch sensor having a bending portion according to the present invention.

FIG. 5 is a sectional view illustrating the fourth embodiment of a touch sensor having a bending portion according to the present invention.

FIG. 6 is a sectional view illustrating the fifth embodiment of a touch sensor having a bending portion according to the present invention.

FIG. 7 is a sectional view illustrating the sixth embodiment of a touch sensor having a bending portion according to the present invention.

FIGS. 8A to 8D illustrate a method of simultaneously forming a base layer of a display portion and a lower support base of a bonding portion in a touch sensor according to the present invention.

BEST MODE

Hereinafter, the present invention will be described in detail with reference to the accompanying drawings.

FIG. 2 is a sectional view of the first embodiment of a touch sensor having a bending portion according to the present invention.

As shown in FIG. 2, the first embodiment of the touch sensor according to the present invention may be configured by a display portion A, a bending portion B, a bonding portion C, and so on.

The display portion A may be configured by a base layer 110, a display portion touch sensor layer 120, a display portion protective layer 130, and so on.

As the base layer 110, a film with good transparency, mechanical strength and thermal stability may be used. Specific examples may include a film made of thermoplastic resins, e.g., polyester resins such as polyethylene terephthalate, polyethylene isophthalate, polyethylene naphthalate and polybutylene terephthalate; cellulose resins such as diacetylcellulose and triacetylcellulose; polycarbonate resins; acrylate resins such as polymethyl (meth)acrylate and polyethyl (meth)acrylate; styrene resins such as polystyrene and acrylonitrile-styrene copolymer; polyolefin resins such as polyethylene, polypropylene, polyolefin having a cyclic or norbornene structure and ethylene-propylene copolymer; vinyl chloride resins; amide resins such as nylon and aromatic polyamide; imide resins; polyether sulfone resins; sulfone resins; polyether ether ketone resins; polyphenylene sulfide resins; vinyl alcohol resins; vinylidene chloride resins; vinyl butyral resins; allylate resins; polyoxymethylene resins; and epoxy resins. Also, a film consisting of a blend of the above thermoplastic resins may be used. In addition, a film made of thermally curable resins or UV curable resins such as (meth)acrylate, urethane, acrylic urethane, epoxy and silicone resins may be used. The base layer 110 may have an elastic modulus of 1000 to 3000 Mpa and a thickness of 40 to 100 μm.

The base layer 110 may include a polarizer, a polarizing plate, a retardation film, a reflective sheet, a brightness enhancing film, a refractive index matching film, or the like.

The display portion touch sensor layer 120 is to sense a touch signal and may include a separation layer, an electrode layer, an insulation layer, and so on.

The separation layer may be applied on a carrier substrate, and the electrode layer or the like may be formed thereon. The separation layer can be finally separated from the carrier substrate. The separation layer preferably has a peeling strength of 1N/25 mm or less, and more preferably 0.1N/25 mm or less.

The separation layer may have a thickness of 10 to 1000 nm, and preferably 50 to 500 nm. If the thickness of the separation layer is less than 10 nm, uniformity is poor when the separation layer is applied, and the formation of the electrode layer may be uneven, or the peeling strength may be locally increased to cause tearing. On the other hand, if the thickness is 1000 nm or more, the peeling strength may be no longer lowered or the film flexibility may be deteriorated.

The separation layer is an organic polymer film, and may be made of, for example, at least one selected from the group consisting of polyimide, poly vinyl alcohol, polyamic acid, polyamide, polyethylene, polystyrene, polynorbornene phenylmaleimide copolymer, polyazobenzene, polyphenylenephthalamide, polyester, polymethyl methacrylate, polyarylate, cinnamate polymer, coumarin polymer, phthalimidine polymer, chalcone polymer and aromatic acetylene polymer.

The electrode layer may be formed on the separation layer. The electrode layer may include a sensing electrode that senses whether or not it has been touched.

The electrode layer is a transparent conductive layer, and may be formed of one or more materials selected from metal, metal nanowire, metal oxide, carbon nanotube, graphene, conductive polymer, and conductive ink.

The metal may be any one of gold (Au), silver (Ag), copper (Cu), molybdenum (Mo), aluminum (Al), palladium (Pd), neodymium (Nd), and silver-palladium-copper alloy (APC). The metal nanowire may be any one of silver nanowire, copper nanowire, zirconium nanowire, and gold nanowire. The metal oxide may be any one of indium tin oxide (ITO), indium zinc oxide (IZO), indium zinc tin oxide (IZTO), aluminum zinc oxide (AZO), gallium zinc oxide (GZO), fluorine tin oxide (FTO), zinc oxide (ZnO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO), and aluminum zinc oxide-silver-aluminum zinc oxide (AZO-Ag-AZO). The conductive polymer may comprise polypyrrole, polythiophene, polyacetylene, PEDOT, polyaniline, and the like. The conductive ink is a mixture of a metal powder and a curable polymeric binder, and an electrode may be formed using the same.

The insulation layer may be formed on the electrode layer. The insulation layer may prevent corrosion of the electrode layer and protect the surface of the electrode layer. The insulation layer may be formed with a constant thickness while filling the gaps between the electrodes or wiring. The surface opposite to the surface in contact with the electrode layer may be formed flat so that the unevenness of the electrode layer is not revealed. The insulation layer can be composed of a curable prepolymer, a curable polymer, a plastic polymer, or the like.

The display portion touch sensor layer 120 may further include a touch sensor protective layer, a bridge, a passivation layer, and so on.

The touch sensor protective layer may be further formed on the separation layer. When it is difficult to protect the electrode layer against contact or impact from the outside with the separation layer alone, one or more touch sensor protective layers may be additionally formed on the separation layer. The touch sensor protective layer may be formed of an organic insulation film, an inorganic insulation film, or the like, and may be formed by a method such as coating and curing, vapor deposition, and the like.

The bridge can be formed on the insulation layer. The bridge may be formed by forming a hole in the insulation layer, and depositing or photo/etching a transparent metal oxide inside the hole and above the insulation layer.

The passivation layer may be formed on the insulation layer and the bridge. The passivation layer protects the bridge. It may be formed of an organic film and formed by a method such as vapor deposition and sputtering. The passivation layer may be made of a material having the same refractive index as the insulation layer.

The display portion protective layer 130 may be combined to the upper portion of the display portion touch sensor layer 120. The display portion protective layer 130 may be a film including an adhesive layer on at least one surface of the film made of a polymer resin, or a film having self-adhesive properties such as polypropylene, and may be used to protect the surface of the display portion touch sensor layer and improve processability.

In the display portion A described above, the display portion touch sensor layer 120 may be a single-layer structure in which a sensing electrode is composed of one layer or a multi-layer structure of two or more layers.

The display portion touch sensor layer 120 may further include a trace electrically connected to the sensing electrode as a part of it, as well as the sensing electrode.

The bending portion B may bend in the thickness direction, for example, backward, and extend to the rear of a display panel (not shown).

The bending portion B may consist of only a bending portion touch sensor layer 120 and bending portion protective layers 310 and 320, and may not include the base layer 110 or the like under the bending portion touch sensor layer 120.

The bending portion touch sensor layer 120 extends from the display portion touch sensor layer 120 and may be configured to have the same structure as the display portion touch sensor layer 120, a detailed description of which is replaced with the description of the display portion A as above.

The bending portion touch sensor layer 120 may further include a touch sensor protective layer, a bridge, a passivation layer, and so on. The touch sensor protective layer, bridge, and passivation layer are also the same as the touch sensor protective layer, bridge, and passivation layer described above in the display portion A, a detailed description of which is replaced with the related description as above.

The bending portion touch sensor layer 120 may have a thickness in the range of 2 to 10 μm when it is comprised of the separation layer, electrode layer, and insulation layer and when it further includes the touch sensor protective layer, bridge, and passivation layer as well.

The bending portion touch sensor layer 120 is described as including the electrode layer (sensing electrode) in the above, but it may be configured to be a part of the trace which does not include the electrode layer (sensing electrode).

The bending portion protective layers 310 and 320 are formed on the upper and lower surfaces of the bending portion touch sensor layer 120, respectively, and may include a lower bending portion protective layer 310 and an upper bending portion protective layer 320.

The bending portion protective layers 310 and 320 may be made of a curable resin. Since the bending portion protective layers 310 and 320 are applied on the bending portion touch sensor layer 120, if the elastic modulus is high, stress may be generated during bending which causes cracks in the bending portion touch sensor layer 120. In order to solve the crack problem of the bending portion touch sensor layer 120, it is checked whether or not a crack occurred in the bending portion touch sensor layer 120 according to the elastic modulus of the bending portion protective layers 310 and 320 when the bending portion B is bent to a radius of 0.3R (radius of the bending portion of a real product).

Table 1 below shows whether a crack occurs in the bending portion touch sensor layer 120 according to the elastic modulus of the curable resin when the bending portion B is bent to 0.3R.

TABLE 1

| Curable resin elastic modulus (Mpa) | Crack occurrence in touch sensor layer (0.3 R) |
|---|---|
| 0.1 | No |
| 10 | No |
| 100 | No |
| 500 | No |
| 1000 | No |
| 1100 | Yes |
| 1500 | Yes |

As it can be seen from Table 1 above, cracks do not occur in the bending portion touch sensor layer 120 when the elastic modulus of the curable resin is in the range of 0.1 to 1000 Mpa. Therefore, in the present invention, the upper limit of the elastic modulus of the curable resin is defined to 1000 Mpa, and such upper limit of the elastic modulus has a technical meaning. On the other hand, the smaller the elastic modulus of the curable resin, the lower the stress applied to the bending portion touch sensor layer 120. However, if the elastic modulus is too low, the rigidity is insufficient and the stickiness increases, which may deteriorate workability. Accordingly, in the present invention, the lower limit of the elastic modulus of the curable resin is defined to 0.1 Mpa, which is the lowest value at which no crack occurs.

As described above, when the bending portion protective layers 310 and 320 are made of a curable resin, if its elastic modulus is set to 0.1 to 1000 Mpa, cracks or breakage of the bending portion touch sensor layer 120 in the bending portion B may be prevented from occurring. The curable resin may be a UV curable resin, an optically clear adhesive (OCA), a pressure sensitive adhesive (PSA), etc., and, for example, it may be formed from an adhesive composition comprising an acrylic copolymer and a crosslinking agent or an adhesive composition comprising an urethane (meth) acrylate resin, a (meth)acrylate ester monomer and a photoinitiator. The bending portion protective layers 310 and 320 may be formed to have a thickness of 1 to 200 μm, and it is preferable that the thickness is smaller than the thickness of the base layer 110, the polarizing film 111, or the protective layer 130.

If the thickness of the bending portion protective layers 310 and 320 is less than 1 μm, uniformity is decreased when the bending portion protective layers 310 and 320 are applied, resulting in non-uniform film formation or voids, causing cracks or tearing in the bending portion touch sensor layer 120. On the other hand, if the thickness of the bending portion protective layers 310 and 320 is more than 200 μm, flexibility may be decreased, or the thickness may become higher than the thickness of the base layer 110, the polarizing film 111, or the protective layer 130, which may cause interference during cover-glass bonding or bending.

The bonding portion C extends from the bending portion B, one side of which is coupled to an FPCB 200, and is comprised of a bonding portion touch sensor layer 120, a lower support base 410, an upper support base 420, and so on.

The bonding portion touch sensor layer 120 extends from the bending portion touch sensor layer 120, and may be configured in the same manner as the display portion touch sensor layer 120 and the bending portion touch sensor layer 120. The bonding portion touch sensor layer 120 may be provided with a bonding pad at one side, that is, at an end. The bonding pad may be bonded to the FPCB 200.

The bonding portion touch sensor layer 120 is described as including the electrode layer (sensing electrode) in the above, but it may be configured to be another part of the trace which does not include the electrode layer (sensing electrode), that is, another part of the trace which extends from the bending portion touch sensor layer 120 that is composed of a part of the trace.

The lower support base 410 may be coupled to the lower portion of the bonding portion touch sensor layer 120 to support the bonding portion touch sensor layer 120 and the lower side of the FPCB 200. The lower support base 410 may be formed of a polymer film having a thickness of 40 to 100 μm, like the base layer 110 of the display portion A.

The upper support base 420 may be combined to overlap the upper portions of the bonding portion touch sensor layer 120 and the FPCB 200. The upper support base 420 may cover and support at least a part of the upper side of the FPCB 200. The upper support base 420 may be formed of a polymer film having a thickness of 40 to 100 μm, like the base layer 110 of the display portion A.

FIG. 3 is a sectional view illustrating the second embodiment of a touch sensor having a bending portion according to the present invention.

As shown in FIG. 3, in the second embodiment, a display portion A may be configured of a polarizing film 111, a PSA 113, a display portion touch sensor layer 120, a display portion protective layer 130, and so on. The PSA 113 may couple the polarizing film 111 serving as a base layer to the display portion touch sensor layer 120.

A bending portion B may be configured of a bending portion touch sensor layer 120, a lower UV curable resin 311 coupled to the lower surface of the bending portion touch sensor layer 120, and an upper UV curable resin 321 coupled to the upper surface of the bending portion touch sensor layer 120. The bending portion touch sensor layer 120 may have a thickness of 2 to 10 μm. The lower and upper UV curable resins 311 and 321 may have elastic moduli of 0.1 to 1000 Mpa and thicknesses of 1 to 200 μm, respectively.

A bonding portion C may be configured of a bonding portion touch sensor layer 120, a lower support base 410, an upper support base 420, and so on.

FIG. 4 is a sectional view illustrating the third embodiment of a touch sensor having a bending portion according to the present invention.

As shown in FIG. 4, in the third embodiment, a display portion A may be configured of a polarizing film 111, a PSA 113, a display portion touch sensor layer 120, an upper OCA 133, a release film 131, and so on. The PSA 113 may couple the polarizing film 111 serving as a base layer to the display portion touch sensor layer 120. The upper OCA 133 may protect the upper surface of the display portion touch sensor layer 120 and couple the release film 131 to the display portion touch sensor layer 120.

A bending portion B may be configured of a bending portion touch sensor layer 120, a lower UV curable resin 311 coupled to the lower surface of the bending portion touch sensor layer 120, and an upper OCA 133 coupled to the upper surface of the bending portion touch sensor layer 120. The upper OCA 133 of the bending portion B may be the same as the upper OCA 133 of the display portion A. The bending portion touch sensor layer 120 may have a thickness of 2 to 10 μm. The lower UV curable resins 311 and the upper OCA 133 may have elastic moduli of 0.1 to 1000 Mpa and thicknesses of 1 to 200 μm, respectively.

A bonding portion C may be configured of a bonding portion touch sensor layer 120, a lower support base 410, an upper support base 420, and so on. In the bonding portion C, the upper OCA 133 of the bending portion B may extend to some areas of the bonding portion touch sensor layer 120 and the upper support base 420.

FIG. 5 is a sectional view illustrating the fourth embodiment of a touch sensor having a bending portion according to the present invention.

As shown in FIG. 5, in the fourth embodiment, a display portion A may be configured of a polarizing film 111, a lower OCA 115, a display portion touch sensor layer 120, an upper OCA 133, release film 131, and so on. The lower OCA 115 may couple the polarizing film 111 serving as a base layer to the display portion touch sensor layer 120. The upper OCA 133 may protect the upper surface of the display portion touch sensor layer 120 and couple the release film 131 to the display portion touch sensor layer 120.

A bending portion B may be configured of a bending portion touch sensor layer 120, a lower OCA 115 coupled to the lower surface of the bending portion touch sensor layer 120, and an upper OCA 133 coupled to the upper surface of the bending portion touch sensor layer 120. The bending portion touch sensor layer 120 may have a thickness of 2 to 10 µm. The lower OCA 115 and the upper OCA 133 may have elastic moduli of 0.1 to 1000 Mpa and thicknesses of 1 to 200 µm, respectively.

A bonding portion C may be configured of a bonding portion touch sensor layer 120, a lower support base 410, an upper support base 420, and so on. The bonding portion C may couple the bonding portion touch sensor layer 120 and the lower support base 410 by extending the lower OCA 115 of the bending portion B therebetween. In the bonding portion C, the upper OCA 133 of the bending portion B may extend to be formed in some areas between the bonding portion touch sensor layer 120 and the upper support base 420.

FIG. 6 is a sectional view illustrating the fifth embodiment of a touch sensor having a bending portion according to the present invention.

As shown in FIG. 6, in the fifth embodiment, a display portion A may be configured of a polarizing film 111, a lower OCA 115, a display portion touch sensor layer 120, a display portion protective layer 130, and so on. The lower OCA 115 may couple the polarizing film 111 serving as a base layer to the display portion touch sensor layer 120.

A bending portion B may be configured of a bending portion touch sensor layer 120, an OCA 115 coupled to the lower surface of the bending portion touch sensor layer 120, and an upper UV curable resin 321 coupled to the upper surface of the bending portion touch sensor layer 120. The bending portion touch sensor layer 120 may have a thickness of 2 to 10 µm. The OCA 115 and the upper UV curable resin 321 may have elastic moduli of 0.1 to 1000 Mpa and thicknesses of 1 to 200 µm, respectively.

A bonding portion C may be configured of a bonding portion touch sensor layer 120, a lower support base 410, an upper support base 420, and so on. In the bonding portion C, the OCA 115 of the bending portion B may extend to be formed between the bonding portion touch sensor layer 120 and the lower support base 410.

FIG. 7 is a sectional view illustrating the sixth embodiment of a touch sensor having a bending portion according to the present invention.

As shown in FIG. 7, in the sixth embodiment, a display portion A may be configured of a display portion base layer 110, a display portion adhesive layer 117, a display portion touch sensor layer 120, a display portion protective layer 130, and so on. The base layer 110 may include a polarizer, a polarizing plate, a retardation film, a reflective sheet, a brightness enhancing film, a refractive index matching film, or the like. As the display portion adhesive layer 117, a pressure sensitive adhesive (PSA), an optically clear adhesive (OCA), or the like may be used. The display portion touch sensor layer 120 may be coupled to the display portion base layer 110 via the display portion adhesive layer 117.

A bending portion B may be configured of only a bending portion touch sensor layer 120 and bending portion protective layers 310 and 320.

A bonding portion C extends from the bending portion B, one side of which is coupled to an FPCB 200. It may be configured of a bonding portion base layer 110, a bonding portion adhesive layer 117, a bonding portion touch sensor layer 120, an upper support base 420, and so on.

FIGS. 8A to 8D illustrate a method of simultaneously forming a base layer of a display portion and a lower support base of a bonding portion in a touch sensor according to the present invention.

FIGS. 8A and 8B are perspective and plan views of a raw base layer 110 used to form a touch sensor of the present invention.

As shown in FIGS. 8A and 8B, the raw base layer 110 may include a through hole H in a region of a bending portion B. The through hole H may be formed to have a width smaller than the width of the raw base layer 110 throughout the region of the bending portion B.

The raw base layer 110 may be coupled via an adhesive layer 117 to one surface of the touch sensor layer 120 provided across a display portion A, the bending portion B and a bonding portion C. At this time, the through hole H of the raw base layer 110 corresponds to the region of the bending portion B, and as a result, in the touch sensor, which is the final product, the through hole H is sealed by the bending portion touch sensor layer 120.

The adhesive layer 117 can be bonded with the touch sensor layer 120 while it is bonded to the raw base layer 110 in advance. At this time, the adhesive layer 117 may also be provided with a through hole at a location corresponding to the through hole H of the raw base layer 110.

When the lower portion of the bending portion touch sensor layer 120 is composed of an adhesive layer such as OCA, PSA, and so on, it may be used as a bending portion protective layer without forming a through hole.

FIG. 8C is a plan view showing a process of punching the raw base layer 110 to form the touch sensor of the present invention.

As shown in FIG. 8C, the touch sensor in which the raw base layer 110, the touch sensor layer 120, and so on are combined may be punched along points spaced a predetermined distance from the edge to the inside. At this time, the punching line CL is located inward than both ends of the through hole H, and as a result, after the punching, the raw base layer 110 may be deformed into a shape in which both sides in the width direction, which are not perforated, are removed.

FIG. 8D is a perspective view showing the sixth embodiment of the touch sensor after punching the raw base layer 110.

As shown in FIG. 8D, the base layer 110 after the punching process is present only in the display portion A and the bonding portion C. In the bending portion B, the bending portion touch sensor layer 120 without a base layer 110 may be present. If the bending portion protective layers 310 and 320 applied on the bending portion touch sensor layer 120 are formed, the bending portion protective layers 310 and 320 are present in the bending portion B region.

In the above, the present invention has been described through various embodiments, which are intended to illustrate the present invention. Those skilled in the art will be able to modify or revise these embodiments in other forms. However, since the scope of the present invention is defined by the claims below, it can be interpreted that such modifications or revisions are included in the scope of the present invention.

DESCRIPTION OF REFERENCE NUMERALS

A: display portion
B: bending portion
C: bonding portion
110: base layer
111: polarizing film
113: PSA
115: lower OCA
117: adhesive layer
120: touch sensor layer
130: protective layer
131: release film
133: upper OCA
200: FPCB
310: lower bending portion protective layer
311: lower UV curable resin
320: upper bending portion protective layer
321: upper UV curable resin
410: lower support base
420: upper support base
CL: punching line
H: through hole

The invention claimed is:

1. A touch sensor comprising:
a display portion including a base layer and a touch sensor layer on the base layer;
a bending portion extending from the display portion and including a first part of a trace electrically connected to the touch sensor layer but not including the base layer; and
a bonding portion extending from the bending portion and including a second part of the trace, wherein an end portion of the second part of the trace is connected to a flexible circuit board,
wherein the base layer includes at least one of a polarizer, a polarizing plate, a retardation film, a reflective sheet, a brightness enhancing film, or a refractive index matching film.

2. The touch sensor according to claim 1, wherein the bending portion includes a bending portion protective layer on an upper or a lower surface of the trace.

3. The touch sensor according to claim 2, wherein the bending portion protective layer is made of a curable resin, and
the curable resin is selected from a UV curable resin, an optically clear adhesive (OCA), and a pressure sensitive adhesive (PSA).

4. The touch sensor according to claim 1, wherein the bending portion is thinner than the display portion and the bonding portion.

5. The touch sensor according to claim 4, wherein the bending portion includes a bending portion touch sensor layer extending from the touch sensor layer of the display portion and having a thickness of 2 to 10 μm.

6. The touch sensor according to claim 4, wherein the bending portion protective layer has an elastic modulus of 0.1 to 1,000 Mpa.

7. A window laminate comprising:
a window substrate; and
the touch sensor according to claim 6 stacked on one surface of the window substrate.

8. An image display device comprising:
a display panel; and
the touch sensor according to claim 6 stacked on the display panel.

9. A window laminate comprising:
a window substrate; and
the touch sensor according to claim 4 stacked on one surface of the window substrate.

10. An image display device comprising:
a display panel; and
the touch sensor according to claim 4 stacked on the display panel.

11. The touch sensor according to claim 1, wherein the bonding portion includes an upper support base and a lower support base on an upper surface and a lower surface of the flexible circuit board, respectively.

12. The touch sensor according to claim 11, wherein the upper support base and the lower support base overlap with the second part of the trace included in the bonding portion.

13. The touch sensor according to claim 11, wherein the lower support base is the same as the base layer of the display portion.

14. The touch sensor according to claim 11, wherein the base layer and the lower support base has a through hole in a region of the bending portion.

15. The touch sensor according to claim 11, further comprising an adhesive layer between the base layer and the touch sensor layer of the display portion and between the lower support base and the trace of the bonding portion.

16. The touch sensor according to claim 15, wherein the adhesive layer has a through hole in a region of the bending portion.

17. A window laminate comprising:
a window substrate; and
the touch sensor according to claim 1 stacked on one surface of the window substrate.

18. An image display device comprising:
a display panel; and
the touch sensor according to claim 1 stacked on the display panel.

* * * * *